US012293962B2

(12) United States Patent
Yu et al.

(10) Patent No.: US 12,293,962 B2
(45) Date of Patent: May 6, 2025

(54) FLIP CHIP AND CHIP PACKAGING STRUCTURE

(71) Applicants: Chengdu BOE Optoelectronics Technology Co., Ltd., Sichuan (CN); BOE TECHNOLOGY GROUP CO., LTD., Beijing (CN)

(72) Inventors: Yong Yu, Beijing (CN); Xuerui Gong, Beijing (CN); Chang Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 414 days.

(21) Appl. No.: 17/765,298

(22) PCT Filed: May 20, 2021

(86) PCT No.: PCT/CN2021/094916
§ 371 (c)(1),
(2) Date: Mar. 30, 2022

(87) PCT Pub. No.: WO2022/001465
PCT Pub. Date: Jan. 6, 2022

(65) Prior Publication Data
US 2022/0367328 A1 Nov. 17, 2022

(30) Foreign Application Priority Data
Jun. 28, 2020 (CN) .................... 202010601611.7

(51) Int. Cl.
*H01L 23/498* (2006.01)
*H01L 23/00* (2006.01)

(52) U.S. Cl.
CPC .. *H01L 23/49811* (2013.01); *H01L 23/49827* (2013.01); *H01L 23/49838* (2013.01);
(Continued)

(58) Field of Classification Search
CPC ......... H01L 23/49811; H01L 23/49827; H01L 23/49838; H01L 23/4985; H01L 23/49866;
(Continued)

(56) References Cited

U.S. PATENT DOCUMENTS

| 1,956,177 A * | 4/1934 | Rothacker ............... B22C 21/02 164/393 |
| 9,293,517 B2 | 3/2016 | Wenbo et al. |

(Continued)

FOREIGN PATENT DOCUMENTS

| CN | 1658716 A | 8/2005 |
| CN | 1956177 | * 5/2007 |

(Continued)

OTHER PUBLICATIONS

International Search Report from PCT/CN2021/094916 dated Aug. 18, 2021.
Written Opinion from from PCT/CN2021/094916 dated Aug. 18, 2021.

*Primary Examiner* — Aaron J Gray
*Assistant Examiner* — Shawn Shaw Muslim
(74) *Attorney, Agent, or Firm* — Calfee, Halter & Griswold LLP (57) ABSTRACT

The present disclosure relates to a flip-chip and a chip packaging structure. The flip-chip includes: a driver chip having a package surface facing a wiring substrate; and a plurality of conductive connectors. Any one of the plurality of conductive connectors includes a conductive bump connected to the package surface and a conductive extension
(Continued)

portion on a side of the conductive bump away from the driver chip.

16 Claims, 4 Drawing Sheets

(52) U.S. Cl.
CPC .... *H01L 23/4985* (2013.01); *H01L 23/49866* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(58) Field of Classification Search
CPC ......... H01L 24/16; H01L 24/32; H01L 24/73; H01L 2224/16227; H01L 2224/32225; H01L 2224/73204; H01L 23/3121; H01L 2924/15312; H01L 2924/3025; H01L 23/552; H01L 23/48; H01L 23/488
See application file for complete search history.

(56) References Cited

U.S. PATENT DOCUMENTS

| | | | |
|---|---|---|---|
| 9,673,168 | B2 | 6/2017 | Kenichi et al. |
| 9,960,138 | B2 | 5/2018 | Kenichi et al. |
| 10,290,774 | B2 * | 5/2019 | Hu ..................... H01L 25/0753 |
| 2004/0017692 | A1 * | 1/2004 | Ferrant ................ G11C 29/848 365/185.01 |
| 2012/0138970 | A1 | 6/2012 | Hong-Shik et al. |
| 2015/0340419 | A1 | 11/2015 | Wenbo et al. |
| 2016/0035678 | A1 * | 2/2016 | Yoo ......................... H01L 24/97 257/737 |
| 2016/0351531 | A1 | 12/2016 | Kenichi et al. |
| 2017/0236795 | A1 | 8/2017 | Kenichi et al. |
| 2019/0103364 | A1 * | 4/2019 | Kim .................. H01L 23/49816 |
| 2020/0286871 | A1 * | 9/2020 | Liff .................. H01L 27/14634 |

FOREIGN PATENT DOCUMENTS

| | | | |
|---|---|---|---|
| CN | 1956177 | A | 5/2007 |
| CN | 100492627 | C | 5/2009 |
| CN | 102237329 | A | 11/2011 |
| CN | 104035253 | A | 9/2014 |
| CN | 105934816 | * | 9/2016 |
| CN | 105934816 | A | 9/2016 |
| CN | 107209411 | A | 9/2017 |
| CN | 110707136 | A | 1/2020 |
| CN | 212136426 | U | 12/2020 |
| IN | 109061935 | A | 12/2018 |
| JP | H08136944 | A | 5/1996 |
| JP | 2002313572 | A | 10/2002 |
| KR | 20040017692 | * | 2/2004 |
| KR | 20040017692 | A | 2/2004 |
| KR | 100869113 | B1 | 11/2008 |
| KR | 20150079317 | A | 7/2015 |

* cited by examiner

FLIP CHIP AND CHIP PACKAGING STRUCTURE

CROSS REFERENCE OF RELATED APPLICATION(S)

This application is a 371 application of PCT Application No. PCT/CN2021/094916, filed May 20, 2021, which claims priority to Chinese patent application No. 202010601611.7, filed on Jun. 28, 2020 and entitled "FLIP CHIP AND CHIP PACKAGING STRUCTURE", the entire contents of which are incorporated herein by reference in its entirety.

TECHNICAL FIELD

Embodiments of the present disclosure generally relate to the display technical field, and more particularly, to a flip-chip and a chip packaging structure.

BACKGROUND

In chip-on-film (COF) products that use double-sided traces, the traces on the back side can be transposed to the front side through metallized vias and then connected to pads on the front side. However, the electrical properties of such chip-on-film are unstable, and G-bright line defects occur in electronic products using such chip-on films, and the occurrence of such defects is progressive and unpredictable. This seriously affects the stability of electronic products and restricts the popularization and application of chip-on-film products that use double-sided traces.

The above information disclosed in this Background section is only for enhancement of understanding of the background of the present disclosure and therefore it may contain information that does not form the prior art that is already known to a person of ordinary skill in the art.

SUMMARY

An objective of the present disclosure is to provide a flip-chip and a chip packaging structure to increase stability of the chip packaging structure.

In order to realize the above objective, embodiments of the present disclosure provide the following technical solutions.

According to a first aspect of the present disclosure, there is provided a flip-chip, including:
  a driver chip having a package surface facing a wiring substrate; and
  a plurality of conductive connectors, wherein any one of the plurality of conductive connectors includes a conductive bump connected to the package surface and a conductive extension portion on a side of the conductive bump away from the driver chip.

In some example embodiments of the present disclosure, along a direction perpendicular to the package surface, a size of the conductive extension portion is 10% to 15% of a size of the conductive bump.

In an example embodiment of the present disclosure, the size of the conductive extension portion along the direction perpendicular to the package surface is 1 to 3 microns.

In an example embodiment of the present disclosure, a size of each of the conductive connectors along a direction perpendicular to the package surface is 10 to 20 microns.

In an example embodiment of the present disclosure, a melting point of the conductive extension portion is lower than a melting point of the conductive bump.

In an example embodiment of the present disclosure, the flip-chip further includes:
  an insulating isolation layer arranged on the package surface and exposing the conductive connectors.

In an example embodiment of the present disclosure, along a direction perpendicular to the package surface, a size of the insulating isolation layer is smaller than a size of the conductive extension portion.

In an example embodiment of the present disclosure, the flip-chip further includes:
  a plurality of insulating bumps connected to the package surface, wherein a distance between the package surface and one end of each of the insulating bumps away from the package surface is smaller than a size of each of the conductive connectors along the direction perpendicular to the package surface.

In an example embodiment of the present disclosure, the distance between the package surface and one end of each of the insulating bumps away from the package surface is smaller than a size of the conductive bump along a direction perpendicular to the package surface.

In an example embodiment of the present disclosure, the plurality of insulating bumps include a first insulating bump and a second insulating bump, a distance between the first insulating bump and an edge of the package surface is smaller than a distance between the second insulating bump and the edge of the package surface; and
  along a direction perpendicular to the package surface, a size of the first insulating bump is larger than a size of the second insulating bump.

In an example embodiment of the present disclosure, a material of the conductive extension portion includes gold and nickel.

According to a second aspect of the present disclosure, there is provided a chip packaging structure, including a wiring substrate and the flip-chip described above;
wherein:
  the wiring substrate has a chip packaging area, and the wiring substrate is provided with a metal via and a plurality of package pads in the chip packaging area; and
  the conductive connectors of the flip-chip are connected to the package pads in a one-to-one correspondence.

In an example embodiment of the present disclosure, the wiring substrate includes:
  a flexible substrate having a first surface and a second surface opposite to each other, wherein the metal via connects the first surface and the second surface;
  a first metal layer arranged on the first surface and including a first lead, a second lead and a plurality of package pads in the chip packaging area, wherein the first lead is connected to the package pads, and the second lead is connected to the package pads and the metal via; and
  a second metal layer arranged on the second surface and including a third lead, wherein the third lead is connected to the metal via.

In an example embodiment of the present disclosure, a melting point of the metal via is greater than a melting point of the conductive extension portion.

In an example embodiment of the present disclosure, a material of the metal via includes silver and copper.

In an example embodiment of the present disclosure, when the flip-chip is provided with an insulating bump, an orthographic projection of the insulating bump on the wiring substrate and an orthographic projection of the metal via on the wiring substrate do not overlap.

In an example embodiment of the present disclosure, the wiring substrate is further provided with:
  conductive leads;
  a first bonding pad for electrical connection with a bonding area of the display panel, wherein the first bonding pad is electrically connected to a part of the package pads through the conductive leads; and
  a second bonding pad for electrical connection with a circuit board, wherein the second bonding pad is electrically connected to a part of the package pads through the conductive leads.

BRIEF DESCRIPTION OF THE DRAWINGS

The above and other features and advantages of the present disclosure will become more apparent from the detailed description of example embodiments with reference to the accompanying drawings.

DETAILED DESCRIPTION

Example embodiments will now be described more fully with reference to the accompanying drawings. Example embodiments, however, can be embodied in various forms and should not be construed as limited to the examples set forth herein; rather, these embodiments are provided so that this disclosure will be thorough and complete, and will fully convey the concept of example embodiments to those skilled in the art. The described features, structures, or characteristics may be combined in any suitable manner in one or more embodiments. In the following description, numerous specific details are provided in order to give a thorough understanding of the embodiments of the present disclosure.

In the figures, the thickness of regions and layers may be exaggerated for clarity. The same reference numerals in the drawings denote the same or similar structures, and thus their detailed descriptions will be omitted.

The described features, structures, or characteristics may be combined in any suitable manner in one or more embodiments. In the following description, numerous specific details are provided in order to give a thorough understanding of the embodiments of the present disclosure. However, one skilled in the art will appreciate that the technical solutions of the present disclosure may be practiced without one or more of the specific details, or other methods, components, materials, etc. may be employed. In other instances, well-known structures, materials, or operations are not shown or described in detail to avoid obscuring the main technical idea of the present disclosure.

The terms "a", "an", "the" are used to indicate the presence of one or more elements/components/etc.; the terms "including" and "having" are used to indicate an open-ended inclusive meaning and means that additional elements/components/etc may be present in addition to the listed elements/components/etc. The terms "first" and "second" etc. are used only as indicators and are not intended to limit the number of their objects.

In the present disclosure, when describing the height or thickness of a structure, it refers to the dimension of the structure along a direction perpendicular to a package surface.

In the related art, the chip on film that uses double-sided wiring includes a flip-chip and a wiring substrate that are connected to each other. The wiring substrate is provided with a through metal via hole and a plurality of package pads in a chip packaging area. The flip-chip includes a driver chip and conductive bumps connected to a package surface of the driver chip, and the conductive bumps are connected to the package pads in a one-to-one correspondence.

Figure 1:
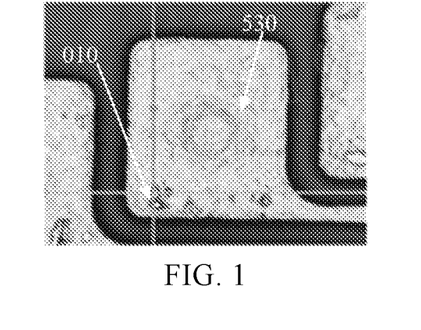
FIG. 1 is a photograph of a metal via in a related art.
Figure 2:
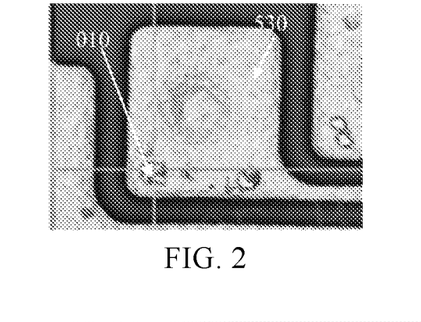
FIG. 2 is a photograph of a metal via in a related art.
Figure 3:
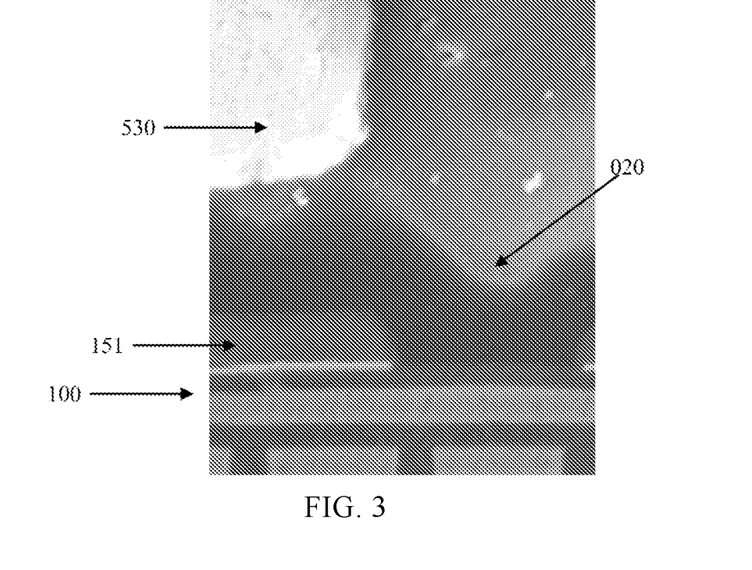
FIG. 3 is a photograph of a film analysis of a chip-on-film in the related art.
Figure 4:
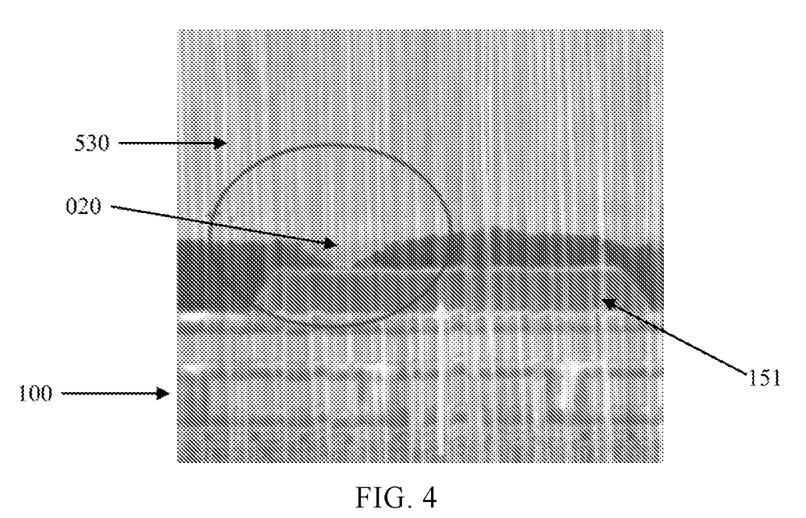
FIG. 4 is a photograph of a film analysis of a chip-on-film in the related art.

However, display products using the chip-on-film with double-sided wiring have poor stability, and have progressive and unpredictable defects such as bright line. Referring to FIG. 1 and FIG. 2, it can be found by analyzing a large number of the chip-on-film with double-sided wiring that there are depressions 010 in partial areas of the metal via 530. FIG. 3 and FIG. 4 are photos of film analysis at the positions of the depressions 010. According to FIG. 3 and FIG. 4, it can be found that protrusions 020 that protrude toward the direction of a driver chip 100 are formed at the positions of the depressions 010; some of the protrusions 020 contact with the driver chip 100, which leads to a short circuit between the metal via 530 and the driver chip 100, and some of the protrusions 020 are too close to the driver chip 100, which may easily generate tip discharge. In particular, referring to FIG. 3, when a shielding metal layer 151 of the driver chip is loaded with a ground voltage, the voltage of the metal via 530 which is in contact with the shielding metal layer 151 through the protrusions 020 will be set to the ground voltage, resulting in errors in corresponding data line signals.

Figure 5:
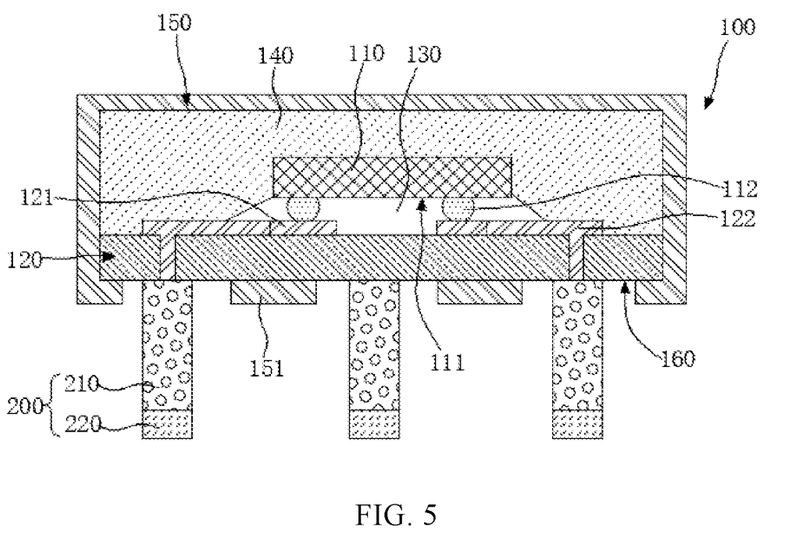
FIG. 5 is a schematic structural diagram of a flip-chip according to an embodiment of the present disclosure.

Based on the above findings, an embodiment of the present disclosure provides a flip-chip. As shown in FIG. 5, the flip-chip includes a driver chip 100 and a plurality of conductive connectors 200. The driver chip 100 has a package surface facing a wiring substrate 160. Any one of the conductive connectors 200 includes a conductive bump 210 connected to the package surface 160 and a conductive extension portion 220 on a side of the conductive bump 210 away from the driver chip 100.

In the flip-chip provided by the embodiment of the present disclosure, the conductive extension portion 220 is provided on the side of the conductive bump 210 away from the driver chip 100, and thus the distance between the driver chip 100 and the wiring substrate is increased. This can avoid occurrence of discharge or contact between conductive materials on the wiring substrate and the driver chip 100, thereby improving the stability of the chip packaging structure in which the flip-chip is applied.

The structures, principles and effects of the flip-chip provided by embodiments of the present disclosure will be further explained and described below with reference to accompanying drawings.

As shown in FIG. 5, the driver chip 100 may include a die 110 and a plurality of die bumps 112. The die 110 has an active surface 111. The active surface 111 is provided with a plurality of die pads electrically connected to an internal integrated circuit of the die 110. The die bumps 112 are electrically connected to die pads in a one-to-one correspondence. The driver chip 100 may further include a package substrate 120. The package substrate 120 may have a connection surface facing the chip 110 and a package surface 160 facing away from the chip 110. The package surface 160 of the package substrate 120 is package surface of the driver chip 100 in embodiments of the present disclosure. The package substrate 120 is provided with connection pads 121 on the connection surface, and the connection pads 121 are electrically connected to the die bumps 112 in a one-to-one correspondence. Conductive connectors 200 are provided on the package surface 160. The package substrate 120 is further provided with connection leads 122 that connect the connection pads 121 and at least part of the conductive connectors 200, so that at least part of the conductive connectors 200 can be electrically connected to the internal integrated circuit of the die 110.

Further, the driver chip 100 may further include a underfilling layer 130. The underfilling layer 130 is disposed between the active surface 111 of the die 110 and the connection surface of the package substrate 120. In this way, the underfilling layer 130 can adhere the die 110 and the package substrate 120 to ensure the stability of the electrical connection between the die bumps 112 and the connection pads 121. The underfilling layer 130 can also support the die 110 to avoid crack damages to the die 110 due to uneven stress. Preferably, the underfilling layer 130 may be made of a material with high thermal conductivity, so as to facilitate the heat dissipation of the die 110 and improve the performance of the driver chip 100.

Further, the driver chip 100 may include an encapsulation shell 140. The encapsulation shell 140 may be located on a side of the package substrate 120 close to the die 110 and cover the die 110, so as to realize the covering and protection of the die 110 and further improve the connection stability between the die 110 and the package substrate 120.

According to some embodiments, the driver chip 100 may further include an electromagnetic shielding structure 150. The electromagnetic shielding structure 150 may be made of a conductive material to shield the electromagnetic interference of the external electromagnetic environment to the driver chip 100. Further, the electromagnetic shielding structure 150 may include a shielding metal layer 151 on the package surface 160. The shielding metal layer 151 may be used to protect the die 110 from the interference of electromagnetic signals in the environment, and may also improve the heat dissipation speed of the driver chip 100. In an embodiment of the present disclosure, the shielding metal layer 151 may also be loaded with a ground signal of the driver chip 100.

Of course, the driver chip 100 may also be of other structures, and the present disclosure does not impose limitations on the specific structure and forms of the driver chip 100 as long as the driver chip can provide the die 110, the conductive connectors 200 electrically connected to the die 110, and the package surface 160 on which the conductive connectors 200 are fixed. For example, the driver chip 100 can also be a substrateless driver chip 100, an underfilling layer is filled between the die bumps 112, and a surface of the underfilling layer away from the die 110 can be used as a package surface 160 of the driver chip 100. The conductive connectors 200 are connected to the surface of the underfilling layer away from the die 110, and at least part of the conductive connectors 200 are electrically connected to the die bumps 112 of the die 110.

In one embodiment of the present disclosure, the driver chip 100 may be a source driver chip of a display device.

In some embodiments, at least some of the conductive connectors 200 are valid conductive connectors 200, and the valid conductive connectors 200 are connected to connection pads 121 through connection leads 122 in one-to-one correspondence, so as to ensure that each valid conductive connector 200 is electrically connected to the integrated circuit of the die 110. In this way, the conductive connectors 200 that are not electrically connected to the connection pads 121 may be invalid conductive connectors 200. These invalid conductive connectors 200 may be used as dummy structures to make the structure of the driver chip 100 more uniform, which is convenient for improving preparation reliability of the driver chip 100, and can provide support when the driver chip 100 is connected to the wiring substrate, so that the pressure at different positions after the driver chip 100 is connected to the wiring substrate is more uniform. Of course, in other embodiments, all the conductive connectors 200 may be valid conductive connectors 200.

In an embodiment of the present disclosure, along a direction perpendicular to the package surface 160, the size of the conductive extension portion 220 is 10% to 15% of the size of the conductive bump 210. In other words, the height of the conductive extension portion 220 is 10% to 15% of the height of the conductive bump 210. Compared with the related art, the flip-chip of the present disclosure increases the heights of the conductive connectors 200, and thus increases the gap between the package surface 160 of the driver chip 100 and the wiring substrate. Thus, the flip-chip of the present disclosure can avoid connection between the conductive structure on the wiring substrate and the package surface 160 and the shielding metal layer 150, and avoid occurrence of the point discharge phenomenon which is resulted from the conductive structures on the wiring substrate being too close to the package surface 160 and the shielding metal layer 151, thereby ensuring the stability of the signals on the wiring substrate. Also, the height of the conductive extension portion 220 is limited to within 15% of the height of the conductive bump 210, so as to avoid that the height of the conductive extension portion 220 is too large and the driver chip 100 is prone to crack damage.

Preferably, along the direction perpendicular to the package surface 160, the size of each of the conductive connectors 200 is 10-20 μm. Further preferably, along the direction perpendicular to the package surface 160, the size of each of the conductive connectors 200 is 14-18 μm. In this way, even if the metal via 530 on the wiring substrate forms the protrusions 020 that protrude toward the flip-chip, the protrusions 020 will not be in contact with the package surface 160 of the flip-chip and the shielding metal layer 151, and a point discharge will not be formed between the protrusions 020 and the package surface 160 of the flip-chip and the shielding metal layer 151. After a lot of verification, no G bright line defect has been found in the display products using the flip-chip according to embodiments of the present disclosure, which proves that the flip-chip according to embodiments of the present disclosure can significantly improves the signal stability on the chip-on-film with double-sided traces.

In an embodiment of the present disclosure, along the direction perpendicular to the package surface 160, the size of the conductive extension portion 220 is 1-3 μm In this way, compared with the related art, the flip-chip according to some embodiments of the present disclosure increases the height of the conductive connector 200 by 1-3 microns, thereby increasing the gap between the package surface 160 of the driver chip 100 and the wiring substrate, preventing the conductive structures on the wiring substrate from being connected to the package surface 160 and the shielding metal layer 151, and preventing the conductive structures on the wiring substrate from being too close to the package surface 160 and the shielding metal layer 151 to cause point discharge, thereby ensuring the stability of the signals on the wiring substrate.

According to some embodiments, the melting point of the conductive extension portion 220 is lower than the melting point of the conductive bump 210. In this way, when the flip-chip is connected to the wiring substrate, the connection temperature can be reduced, for example, the soldering temperature can be reduced, thereby reducing the possibility of melting the metal material in the metal via 530 on the wiring substrate, reducing the probability of forming the protrusions 020 that protrude toward the flip-chip in the metal via 530 and reducing the size of the protrusions 020 formed, thereby further reducing the possibility of short circuit or point discharge between the protrusions 020 and the driver chip 100. Further, according to some embodiments, the main component of the conductive extension portion 220 can be the same as the main component of the conductive bump 210, and by adjusting the secondary component in the conductive extension portion 220 or adjusting the ratio of the main component, the melting point of the conductive extension portion 220 can be adjusted as lower than the melting point of the conductive bump 210, and the stability of the connection between the conductive bump 210 and the conductive extension portion 220 can be ensured. For example, in one embodiment of the present disclosure, the material of the conductive bump 210 is gold-nickel alloy, the material of the conductive extension portion 220 may be gold-nickel alloy and the ratio of gold and nickel is different from that of the conductive bump 210. For another example, the material of the conductive bump 210 is gold-nickel alloy, and the material of the conductive extension portion 220 is tin-doped gold-nickel alloy or indium-doped gold-nickel alloy. Of course, the above are only examples of the materials of the conductive bump 210 and the conductive extension portion 220, and other materials can also be selected for the conductive bump 210 and the conductive extension portion 220 to ensure good electrical conductivity and good connection stability.

In some other embodiments of the present disclosure, the materials of the conductive bump 210 and the conductive extension portion 220 may be the same. Further, the conductive bump 210 and the conductive extension portion 220 may have a one-piece structure.

Further, the material of the conductive extension portion 220 is matched with the material of the package pad 513 of the wiring substrate, so that the conductive extension portion 220 and the package pad 513 have good wettability during soldering, and the connection strength between the conductive extension portion 220 and the package pad 513 can be increased, and the contact resistance at the interface between conductive extension portion 220 and the package pad 513 can be reduced. Preferably, the material of the conductive extension portion 220 includes gold and nickel.

According to some embodiments, the material of the conductive extension portion 220 may be reasonably selected so that the melting point of the conductive extension portion 220 is higher than the material of the metal via 530, thereby reducing the possibility of melting the metal material in the metal via 530 when the driver chip 100 is connected to the wiring substrate, reducing the probability of forming the protrusions 020 that protrude toward the flip-chip in the metal via 530 and reducing the size of the protrusions 020 formed, thereby further reducing the probability of the short circuit or point discharge between the protrusions 020 and the driver chip 100.

According to some embodiments, when preparing the flip-chip, the stacked conductive bumps 210 and the conductive extension portion 220 may be sequentially formed on the package surface 160, and then the conductive connectors 200 provided on the package surface 160 may be formed; or, conductive connectors 200 are formed on a sacrificial substrate, and then the conductive connectors 200 are connected to the package surface 160.

For example, in one embodiment of the present disclosure, the conductive bumps 210 may be formed on the package surface 160 by using a first metal wire, and then the conductive extension portions 220 may be formed on the surface of the conductive bumps 210 away from the package surface 160 by using a second metal wire.

For another example, in another embodiment of the present disclosure, a conductive extension portion material layer and a conductive bump material layer stacked in sequence may be formed on a sacrificial substrate first, and then the conductive extension portion material layer and the conductive bump material layer are patterned, so that the remaining conductive extension portion material layer forms the conductive extension portions 220, and the remaining conductive bump material layer forms the conductive bumps 210; the conductive bumps 210 are bonded to the package surface 160 of the driver chip 100, and the sacrificial substrate is then removed to form a flip-chip.

Of course, other methods or strategies may also be used when preparing the conductive connectors 200 on the package surface 160, which is not limited in the present disclosure, as long as a flip-chip with the conductive connectors 200 can be fabricated.

Figure 6:
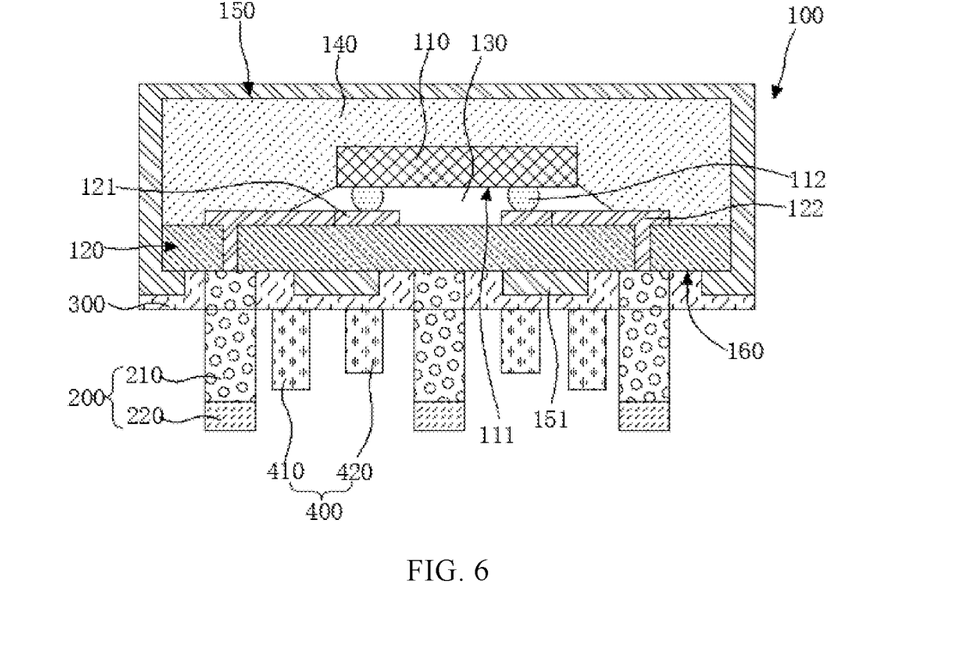
FIG. 6 is a schematic structural diagram of a flip-chip according to an embodiment of the disclosure.

According to some embodiments, as shown in FIG. 6, the flip-chip may further include an insulating isolation layer 300. The insulating isolation layer 300 is disposed on the package surface 160 and exposes the conductive connectors 200. In this way, the insulating isolation layer 300 can isolate the package surface 160 from the wiring substrate. Even if the protrusions 020 are formed in the metal via 530 of the wiring substrate, the protrusions 020 are insulated from the package surface 160 due to the blocking by the insulating isolation layer 300. It can be understood that when the flip-chip is provided with the shielding metal layer 151, the insulating isolation layer 300 may be provided on a side of the shielding metal layer 151 away from the package surface 160 to isolate the shielding metal layer 151 from the wiring substrate.

Further, according to some embodiments, along the direction perpendicular to the package surface 160, the size of the insulating isolation layer 300 is smaller than the size of the conductive extension portion 220. In this way, it is possible to avoid space competition after the insulating isolation layer 300 is connected to the protrusions 020 formed in the metal via 530, and to prevent the protrusions 020 formed in the metal via 530 from affecting the connection between the conductive extension portion 220 and the package pads 513 and ensuring the stability of the connection between the flip-chip and the wiring substrate.

According to some embodiments, the material of the insulating isolation layer 300 may be an organic material, so as to be formed on the package surface 160 by means of screen printing or the like.

According to some embodiments, as shown in FIG. 6, the flip-chip may further include a plurality of insulating bumps 400. The insulating bumps 400 are connected to the package surface 160. The distance between the package surface 160 and one end of each of the insulating bumps 400 away from the package surface 160 is smaller than the size of each of the conductive connectors 200 along the direction perpendicular to the package surface 160. In this way, the insulating bumps 400 may be disposed between the package surface 160 and the wiring substrate as a support structure to provide support when the driver chip 100 is deformed, so as to prevent the driver chip 100 from being damaged (such as cracks) by a large external force. The distance between the package surface 160 and one end of each of the insulating bumps 400 away from the package surface 160 is smaller than the size of each of the conductive connectors 200 along the direction perpendicular to the package surface 160. Therefore, when the driver chip 100 is connected to the wiring substrate, under normal circumstances, the insulating bumps 400 are not in contact with the wiring substrate, so as to prevent the insulating bumps 400 from colliding with the wiring substrate and hindering the connection between the conductive connectors 200 and the package pads 513; however, the apexes of the insulating bumps 400, that is, end points of the insulating bumps 400 away from the package surface 160, are relatively close to the wiring substrate, so that when the driver chip 100 is deformed, the insulating bumps 400 can be driven against the wiring substrate, thereby weakening or preventing the continuous deformation of the driver chip 100 and achieving the purpose of protecting the driver chip 100.

Further, according to some embodiments, as shown in FIG. 6, the insulating bump 400 includes a first insulating bump 410 and a second insulating bump 420. The distance between the first insulating bump 410 and an edge of the package surface 160 is smaller than the distance between the second insulating bump 420 and the edge of the package surface 160; along the direction perpendicular to the package surface 160, the size of the first insulating bump 410 is larger than the size of the second insulating bump 420. When the driver chip 100 is deformed, the smaller the distance from the edge of the package surface 160 is, the smaller the deformation amount is; the larger the distance from the edge of the package surface 160 is, the larger the deformation amount is. Therefore, the first insulating bump 410 may be provided at a position close to the edge of the package surface 160; the second insulating bump 420 may be provided at a position far from the edge of the package surface 160.

According to some other embodiments, the insulating bumps 400 may also include insulating bumps 400 of other sizes, and the size of these insulating bumps 400 along the direction perpendicular to the package surface 160 may be related to their positions. For example, the insulating bump 400 may further include a third insulating bump 400, and the distance between the third insulating bump 400 and the edge of the package surface 160 is smaller than the distance between the first insulating bump 410 and the edge of the package surface 160; along the direction perpendicular to the package surface 160, the size of the third insulating bump 400 is not smaller than the size of the first insulating bump 410. For another example, the insulating bumps 400 may further include a fourth insulating bump 400, and the distance between the fourth insulating bump 400 and the edge of the package surface 160 is greater than the distance between the first insulating bump 410 and the edge of the package surface 160, and smaller than the distance between the second insulating bump 420 and the edge of the package surface 160; along the direction perpendicular to the package surface 160, the size of the fourth insulating bump 400 is not greater than the size of the first insulating bump 410, and is not smaller than the size of the second insulating bump 420. For another example, the insulating bumps 400 may further include a fifth insulating bump 400, and the distance between the fifth insulating bump 400 and the edge of the package surface 160 is greater than the distance between the second insulating bump 420 and the edge of the package surface 160; along the direction perpendicular to the package surface 160, the size of the fifth insulating bump 400 is not larger than that of the second insulating bump 420.

In one embodiment of the present disclosure, the positions of the insulating bumps 400 can be reasonably set, so that when the driver chip 100 is connected to the wiring substrate, the orthographic projection of each insulating bump 400 on the wiring substrate does not overlap with the orthographic projection of each metal via 530 on the wiring substrate. In this way, the space competition between the protrusions 020 formed in the metal vias 530 and the insulating bumps 400 (which may affect the connection between the conductive connectors 200 and the package pads 513) can be avoided.

In one embodiment of the present disclosure, the flip-chip includes an insulating isolation layer 300 covering the shielding metal layer 151, and insulating bumps 400 disposed on a side of the insulating isolation layer 300 away from the package surface 160. In this way, the insulating bumps 400 are connected to the package surface 160 through the insulating isolation layer 300.

An embodiment of the present disclosure further provides a chip packaging structure. The chip packaging structure includes any flip-chip described in the above-mentioned flip-chip embodiments. The chip packaging structure may be a chip on film with double-sided wiring, a flexible circuit board 700 packaged with the driver chip 100, or other types of chip packaging structures. Since the chip packaging structure has any flip-chip described in the above-mentioned embodiments of the driver chip 100, the chip packaging structure has the same beneficial effects as the flip-chip, and details are not described herein again.

Preferably, the chip packaging structure may be a chip-on-film with double-sided wiring. Further preferably, the chip packaging structure may be a chip-on-film of a source driver of a display device, which may be bonded to the bonding area of the display panel.

It can be understood that, the chip packaging structure may be provided with one driver chip 100 or a plurality of driver chips 100, which is not specifically limited in the present disclosure.

Figure 7:
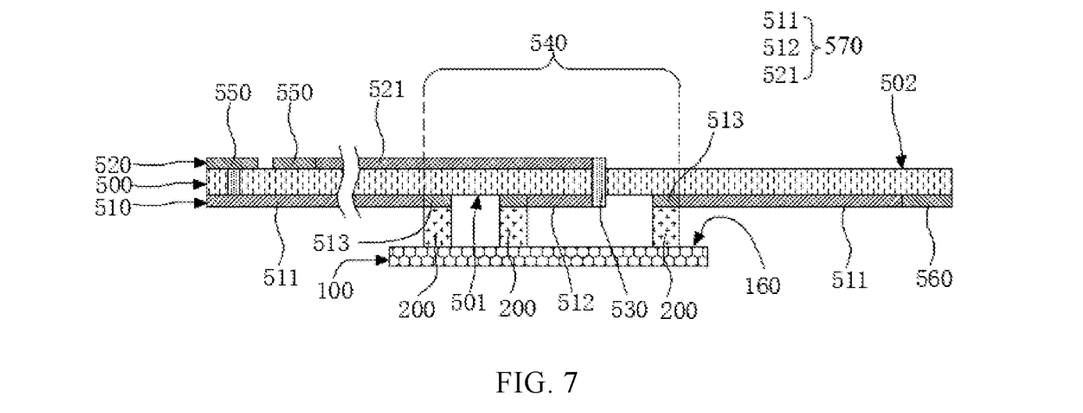
FIG. 7 is a schematic structural diagram of a chip packaging structure according to an embodiment of the present disclosure.

According to some embodiments, as shown in FIG. 7, the chip packaging structure includes a wiring substrate and any flip-chip described in the above flip-chip embodiments. The wiring substrate has a chip packaging area 540, and the wiring substrate is provided with a metal via 530 and a plurality of package pads 513 in the chip packaging area 540; the conductive connectors 200 of the flip-chip are connected to the package pads 513 in a one-to-one correspondence.

Further, according to some embodiments, the wiring substrate is further provided with conductive leads 570, and the conductive leads 570 are electrically connected to the package pads 513 so as to input signals to the driver chip 100 or receive signals outputted from the driver chip 100.

Exemplarily, in one embodiment of the present disclosure, the wiring substrate includes a flexible substrate 500, a first metal layer 510 and a second metal layer 520.

The flexible substrate 500 has a first surface 501 and a second surface 502 opposite to each other. The metal via 530 connects the first surface 501 and the second surface 502. The first metal layer 510 is provided on the first surface 501, and includes a first lead 511 and a second lead 512 and further includes a package pad 513 in the chip packaging area 540. The first lead 511 is connected to the package pad 513. The second lead 512 is connected to the package pad 513 and the metal via 530. The second metal layer 520 is provided on the second surface 502 and includes a third lead 513, and the third lead 513 is connected to the metal via 530.

As such, the conductive leads 570 may include the first lead 511, the second lead 512 and the third lead 513. The first lead 511 and the second lead 512 are directly connected to the package pad 513, and the third lead 513 is indirectly connected to the package pad 513 through the metal via 530 and the second lead 512.

It can be understood that, in the chip packaging area 540, the flexible substrate 500 is provided with connection vias corresponding to the metal vias 530 one-to-one, and the metal vias 530 pass through the connection vias in a one-to-one correspondence.

Figure 8:
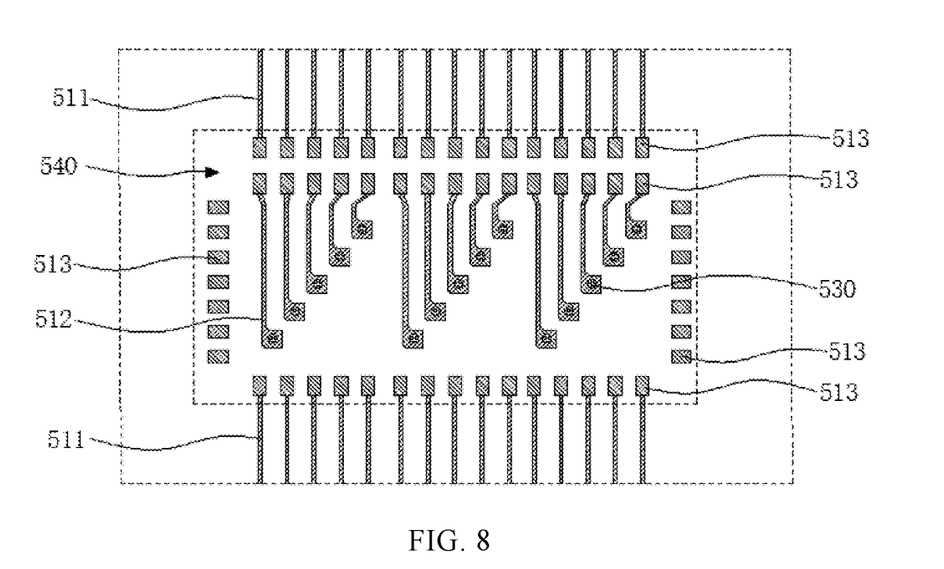
FIG. 8 is a schematic structural diagram of a chip packaging area according to an embodiment of the present disclosure.

In an embodiment of the present disclosure, as shown in FIG. 8, at least part of the package pads 513 are not connected to any one of the conductive leads 570, that is, not electrically connected to the first lead 511, the second lead 512 and the third lead 513. These package pads 513 are used to connect with the invalid conductive connectors 210 to provide a balanced support force for the driver chip 100.

In an embodiment of the present disclosure, as shown in FIG. 8, each of the second leads 512 is disposed in the chip packaging area 540.

In an embodiment of the present disclosure, the second leads 512 are disposed in a one-to-one correspondence with the metal vias 530, and any one of the second leads 512 is connected to a corresponding metal via 530, so that any one of the metal vias 530 is connected to one package pad 513.

In one embodiment of the present disclosure, the melting point of the metal via 530 is greater than the melting point of the conductive extension portion 220. Preferably, the material of the metal via 530 includes silver and copper to ensure that the metal via 530 has low impedance, reduce the loss of the driving signal on the metal via 530 and reduce the power consumption of the chip packaging structure.

In one embodiment of the present disclosure, when the flip-chip is provided with the insulating bumps 400, the orthographic projection of each of the insulating bumps 400 on the wiring substrate does not overlap with the orthographic projection of each of metal vias 530. In particular, the orthographic projection of each of the insulating bumps 400 on the flexible substrate 500 of the wiring substrate does not overlap with the orthographic projection of each of the metal vias 530.

Figure 9:
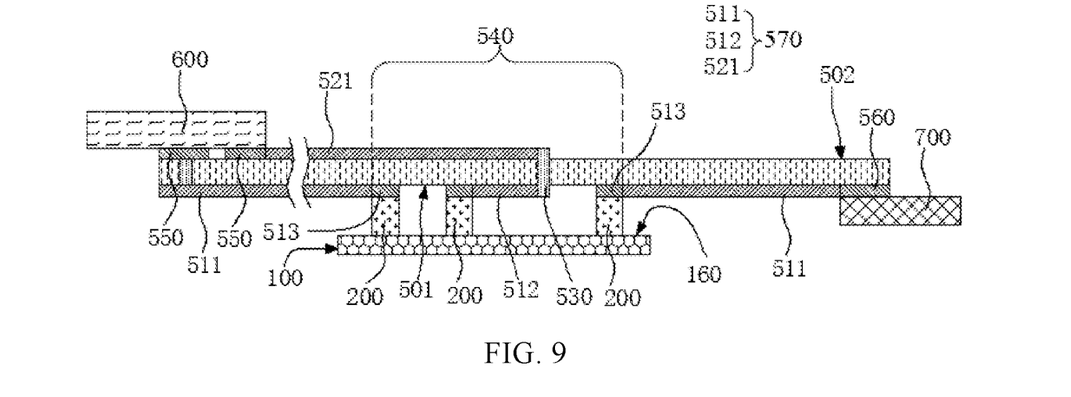
FIG. 9 is a schematic structural diagram in which a chip packaging structure is connected to a display panel and a circuit board according to an embodiment of the present disclosure.

In one embodiment of the present disclosure, as shown in FIGS. 7 and 9, the wiring substrate further includes a plurality of first bonding pads 550 and a plurality of second bonding pads 560.

The first bonding pads 550 are used for electrical connection with a load, for example, for electrical connection with the bonding area of a display panel 600. The first bonding pads 550 are connected to a part of the package pads 513 through conductive leads 570 provided on the wiring substrate, so as to enable interaction between the driver chip 100 and the load. In one embodiment of the present disclosure, at least part of the first leads 511 and at least part of the third leads 521 are electrically connected to the first bonding pads 550. In this way, the driver chip 100 can load a driving signal to the load through the first bonding pads 550. Of course, if the load is provided with sensing elements, for example, if the display panel 600 is provided with a fingerprint recognition sensor, a touch sensor, etc., the sensing signals of these sensing elements can also be transmitted to the driver chip 100 through the first bonding pads 550.

The second bonding pads 560 are used for electrical connection with the circuit board 700, for example, for electrical connection with a flexible circuit board of a display device. The second bonding pads 560 are electrically connected to part of the package pads 513 through the conductive leads 570 provided on the wiring substrate, so as to enable interaction between the driver chip 100 and the circuit board 700. In one embodiment of the present disclosure, a part of the first leads 511 or a part of the third leads 521 are connected to the second bonding pads 560 electrically. The second bonding pads 560 are used for the circuit board 700 to send signals to the driver chip 100 to control the driver chip 100. Exemplarily, the second bonding pads 560 can receive data signals from a timing controller through the flexible circuit board 700, etc. Of course, if the load is provided with sensing elements, the sensing signals of these sensing elements can also be transmitted to other processors through the second bonding pads 560 and the flexible circuit board 700.

Further, other via holes may be provided on the flexible substrate 500, so that the first leads 511 can be changed to the second surface 502, or the second lead 512 can be changed to the first surface 501, so as to ensure that the first leads 511 or the second leads 512 can be electrically connected to the first bonding pads 550 or the second bonding pads 560. In other words, when the first bonding pads 550 are provided on the first surface 501, the second leads 512 can be changed to the first surface 501 through a via hole provided in the flexible substrate 500 and connected to the first bonding pads 550; when the first bonding pads 550 are arranged on the second surface 502, the first leads 511 can be changed to the second surface 502 through a via hole arranged in the flexible substrate 500 and connected to the first bonding pads 550; when the second bonding pads 560 are arranged on the first surface 501, the second leads 512 can be changed to the first surface 501 through a via hole arranged in the flexible substrate 500 and connected to the second bonding pads 560; when the second bonding pads 560 are arranged on the first surface 501, the first leads 511 can be changed to the first surface 501 through a via hole arranged in the flexible substrate 500 and connected to the second bonding pads 560.

It should be understood that the present disclosure does not limit its application to the detailed structures and arrangements of components set forth in this specification. The present disclosure may be embodied in other way, and implemented and carried out in various manners. Variations and modifications fall within the scope of the present disclosure. It will be understood that the embodiments disclosed and defined in this specification extend to all alternative combinations of two or more of the individual features mentioned or evident in the text and/or drawings. All of these different combinations constitute various alternative aspects of the present disclosure. The embodiments illustrate the best mode known for carrying out the present disclosure, and will enable those skilled in the art to utilize the present disclosure.

What is claimed is:

1. A flip-chip, comprising:
a driver chip having a package surface facing a wiring substrate;
a plurality of conductive connectors, wherein any one of the plurality of conductive connectors comprises a conductive bump connected to the package surface and a conductive extension portion on a side of the conductive bump away from the driver chip; and
a plurality of insulating bumps connected to the package surface, wherein a distance between the package surface and one end of each of the insulating bumps away from the package surface is smaller than a size of each of the conductive connectors along a direction perpendicular to the package surface;
wherein the plurality of insulating bumps comprise a first insulating bump and a second insulating bump, a distance between the first insulating bump and a side edge of the driver chip is smaller than a distance between the second insulating bump and the side edge of the driver chip; and
wherein along the direction perpendicular to the package surface, a size of the first insulating bump is larger than a size of the second insulating bump;
wherein the driver chip further comprises an electromagnetic shielding structure, the electromagnetic shielding structure comprises a shielding metal layer on the package surface, and the shielding metal layer is loaded with a ground signal of the driver signal;
wherein a melting point of the conductive extension portion is lower than a melting point of the conductive bump, and the melting point of the conductive extension portion is lower than a melting point of a metal via in the wiring substrate.

2. The flip-chip according to claim 1, wherein along a direction perpendicular to the package surface, a size of the conductive extension portion is 10% to 15% of a size of the conductive bump.

3. The flip-chip according to claim 2, wherein the size of the conductive extension portion along the direction perpendicular to the package surface is 1 to 3 microns.

4. The flip-chip according to claim 1, wherein a size of each of the conductive connectors along a direction perpendicular to the package surface is 10 to 20 microns.

5. The flip-chip according to claim 1, further comprising:
an insulating isolation layer arranged on the package surface and exposing the conductive connectors.

6. The flip-chip according to claim 5, wherein along a direction perpendicular to the package surface, a size of the insulating isolation layer is smaller than a size of the conductive extension portion.

7. The flip-chip according to claim 1, wherein the distance between the package surface and one end of each of the insulating bumps away from the package surface is smaller than a size of the conductive bump along a direction perpendicular to the package surface.

8. The flip-chip according to claim 1, wherein a material of the conductive extension portion comprises gold and nickel.

9. A chip packaging structure, comprising a wiring substrate and a flip-chip;
wherein the flip-chip comprises:
a driver chip having a package surface facing a wiring substrate; and
a plurality of conductive connectors, wherein any one of the plurality of conductive connectors comprises a conductive bump connected to the package surface and a conductive extension portion on a side of the conductive bump away from the driver chip;
wherein:
the wiring substrate has a chip packaging area, and the wiring substrate is provided with a metal via and a plurality of package pads in the chip packaging area; and
the conductive connectors of the flip-chip are connected to the package pads in a one-to-one correspondence;
wherein the flip-chip further comprises:
a plurality of insulating bumps connected to the package surface, wherein a distance between the package surface and one end of each of the insulating bumps away from the package surface is smaller than a size of each of the conductive connectors along a direction perpendicular to the package surface;
wherein the plurality of insulating bumps comprise a first insulating bump and a second insulating bump, a distance between the first insulating bump and a side edge of the driver chip is smaller than a distance between the second insulating bump and the side edge of the driver chip; and
wherein along the direction perpendicular to the package surface, a size of the first insulating bump is larger than a size of the second insulating bump;
wherein the driver chip further comprises an electromagnetic shielding structure, the electromagnetic shielding structure comprises a shielding metal layer on the package surface, and the shielding metal layer is loaded with a ground signal of the driver signal;
wherein a melting point of the conductive extension portion is lower than a melting point of the conductive bump, and the melting point of the conductive extension portion is lower than a melting point of the metal via in the wiring substrate.

10. The chip packaging structure according to claim 9, wherein the wiring substrate comprises:
a flexible substrate having a first surface and a second surface opposite to each other, wherein the metal via connects the first surface and the second surface;
a first metal layer arranged on the first surface and comprising a plurality of package pads in the chip packaging area, a first lead, and a second lead, wherein the first lead is connected to the package pads, and the second lead is connected to the package pads and the metal via; and
a second metal layer arranged on the second surface and comprising a third lead, wherein the third lead is connected to the metal via.

11. The chip packaging structure according to claim 9, wherein a material of the metal via comprises silver and copper.

12. The chip packaging structure according to claim 9, wherein when the flip-chip is provided with an insulating bump, an orthographic projection of the insulating bump on the wiring substrate and an orthographic projection of the metal via on the wiring substrate do not overlap.

13. The chip packaging structure according to claim 9, wherein the wiring substrate is further provided with:
   conductive leads;
   a first bonding pad for electrical connection with a bonding area of the display panel, wherein the first bonding pad is electrically connected to a part of the package pads through the conductive leads; and
   a second bonding pad for electrical connection with a circuit board, wherein the second bonding pad is electrically connected to a part of the package pads through the conductive leads.

14. The chip packaging structure according to claim 9, wherein along a direction perpendicular to the package surface, a size of the conductive extension portion is 10% to 15% of a size of the conductive bump.

15. The chip packaging structure according to claim 14, wherein the size of the conductive extension portion along the direction perpendicular to the package surface is 1 to 3 microns.

16. The chip packaging structure according to claim 9, wherein a size of each of the conductive connectors along a direction perpendicular to the package surface is 10 to 20 microns.

\* \* \* \* \*